United States Patent
Huang

(10) Patent No.: US 10,914,807 B2
(45) Date of Patent: Feb. 9, 2021

(54) POINT STICK DEVICE AND POINT STICK MODULE

(71) Applicant: ELAN MICROELECTRONICS CORPORATION, HsinChu (TW)

(72) Inventor: Chun-Chieh Huang, New Taipei (TW)

(73) Assignee: Elan Microelectronics Corporation, Hsinchu (TW)

(*) Notice: Subject to any disclaimer, the term of this patent is extended or adjusted under 35 U.S.C. 154(b) by 485 days.

(21) Appl. No.: 15/856,607

(22) Filed: Dec. 28, 2017

(65) Prior Publication Data

US 2018/0259609 A1 Sep. 13, 2018

Related U.S. Application Data

(60) Provisional application No. 62/470,353, filed on Mar. 13, 2017.

(30) Foreign Application Priority Data

Jun. 8, 2017 (TW) .............................. 106119034 A

(51) Int. Cl.
*G01R 35/00* (2006.01)
*G01L 1/20* (2006.01)
*G01L 5/161* (2020.01)

(52) U.S. Cl.
CPC .............. *G01R 35/007* (2013.01); *G01L 1/20* (2013.01); *G01L 5/161* (2013.01)

(58) Field of Classification Search
CPC ......... H04B 1/00; H04B 2201/00; H04L 1/00; H04L 2201/00; G01B 1/00; G01B 2210/00; G01R 1/00
See application file for complete search history.

(56) References Cited

U.S. PATENT DOCUMENTS

| | | | | |
|---|---|---|---|---|
| 9,967,115 | B1* | 5/2018 | Zhang | H04L 25/03891 |
| 2013/0076551 | A1* | 3/2013 | Marukame | H03K 5/2481 |
| | | | | 341/159 |
| 2013/0157786 | A1* | 6/2013 | Joseph | A63B 47/02 |
| | | | | 473/436 |
| 2015/0038096 | A1* | 2/2015 | Robinson | H04B 1/16 |
| | | | | 455/200.1 |
| 2015/0339876 | A1* | 11/2015 | Koza | G07F 17/3244 |
| | | | | 463/16 |
| 2017/0010730 | A1 | 1/2017 | Chuang et al. | |
| 2018/0129346 | A1* | 5/2018 | Hargreaves | G06F 3/0418 |

FOREIGN PATENT DOCUMENTS

| | | |
|---|---|---|
| CN | 105892754 A | 8/2016 |
| CN | 106020559 A | 10/2016 |
| CN | 106325602 A | 1/2017 |
| TW | I489323 B | 6/2015 |

* cited by examiner

*Primary Examiner* — Jermele M Hollington
*Assistant Examiner* — Temilade S Rhodes-Vivour
(74) *Attorney, Agent, or Firm* — Muncy, Geissler, Olds & Lowe, P.C.

(57) ABSTRACT

A point stick module has a sensing device, a rank unit and a signal processing device. The sensing device outputs multiple sensing signals in response to operations done by a user. The rank unit provides a rank signal to represent a rank of the sensing device. The signal processing device is coupled to the sensing device and the rank unit to receive the multiple sensing signals and the rank signal, wherein the signal processing device selects a parameter according to the rank signal.

25 Claims, 8 Drawing Sheets

POINT STICK DEVICE AND POINT STICK MODULE

CROSS REFERENCE TO RELATED APPLICATIONS

This non-provisional application claims the benefit under 35 U.S.C. § 119(e) to U.S. Provisional Application No. 62/470,353 filed on Mar. 3, 2017 and under 35 U.S.C. § 119(a) to Patent Application No. 106119034 filed in Taiwan on Jun. 8, 2017, all of which are hereby expressly incorporated by reference into the present application.

BACKGROUND OF THE INVENTION

1. Field of the Invention

The present invention relates to an input device and, more particularly, to a point stick module.

2. Description of the Related Art

With reference to FIG. 8, a point stick module, or named as a track point module, comprises a sensing device 91 and a signal processing device 92. The sensing device 91 has a stick and multiple variable resistors. The multiple variable resistors form a Wheatstone bridge. The stick is provided to be operated by a user. The multiple variable resistors are used to generate sensing signals in response to the operation of the user. The signal processing device 92 processes the sensing signals to obtain processing results. The processing results may be applied to control a cursor of an electronic device, for example, to control moving directions and a moving distance of the cursor. The greater the force is applied on the stick, the greater distance the cursor moves. However, due to processing factors, different sensing devices 91 operated with the same force may generate sensing signals of different strengths. Therefore, the performances of the different sensing devices 91 inconsistent with each other.

SUMMARY OF THE INVENTION

An objective of the present invention is to provide a point stick device to solve the problems mentioned above.

To achieve the foregoing objective, the point stick device comprises:

a sensing device comprising multiple variable resistors for generating multiple sensing signals;

a rank unit for providing a rank signal, wherein the rank signal corresponds to a rank of the sensing device; and a transmission device coupled to the sensing device and the rank unit for transmitting the multiple sensing signals and the rank signal.

Another objective of the present invention is to provide a point stick module. The point stick module comprises:

a sensing device comprising multiple variable resistors for generating multiple sensing signals;

a rank unit for providing a rank signal, wherein the rank signal corresponds to a rank of the sensing device;

a transmission device coupled to the sensing device and the rank unit for transmitting the multiple sensing signals and the rank signal; and a signal processing device coupled to the transmission device for receiving the multiple sensing signals and the rank signal, wherein the signal processing device selects a parameter applied to a processing procedure according to the rank signal, and the signal processing device processes the multiple sensing signals to obtain multiple output values by the processing procedure.

According to the present invention, different point stick modules would have similar performance without need of preparing different signal processing devices to operate in conjunction with the sensing devices of different ranks. The invention reduces the complexity of production management or assembly management of the point stick modules.

Other objectives, advantages and novel features of the invention will become more apparent from the following detailed description when taken in conjunction with the accompanying drawings.

DETAILED DESCRIPTION OF THE INVENTION

Figure 1:
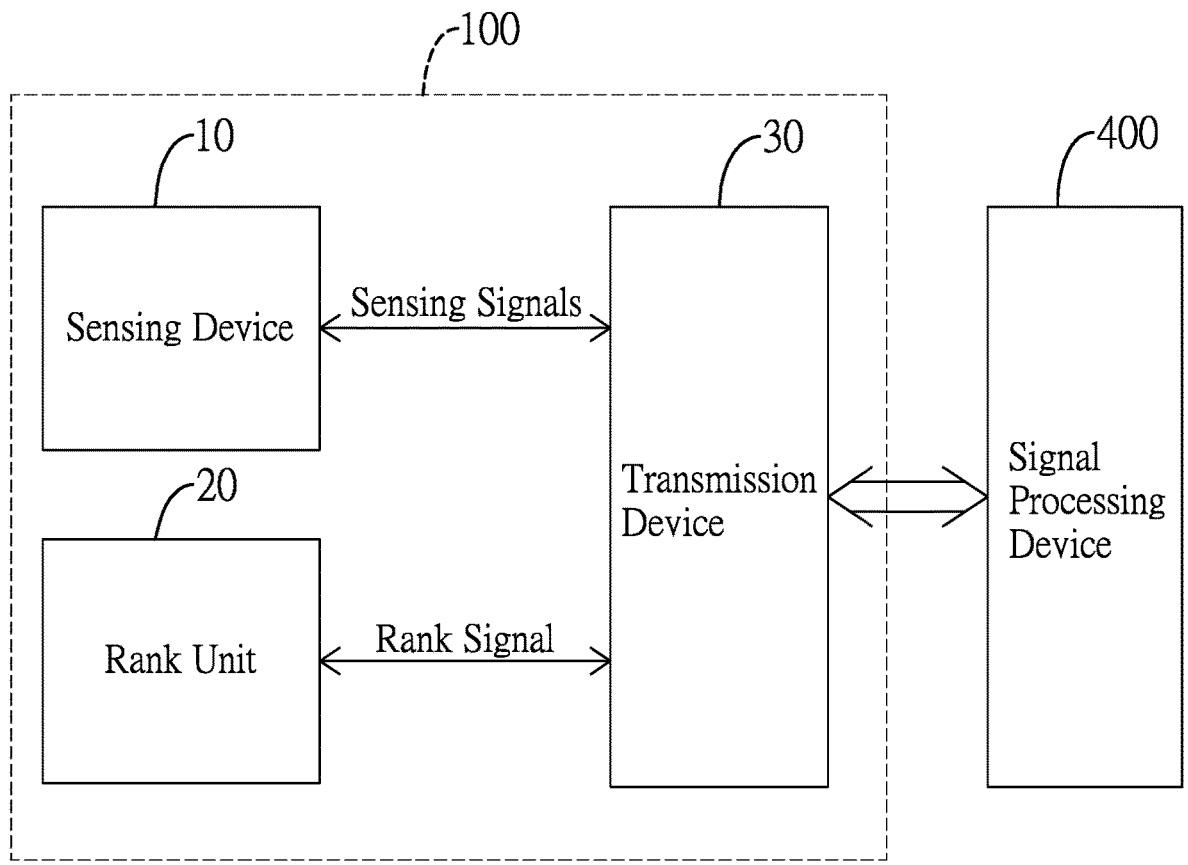
FIG. 1 is a block diagram of a point stick module in accordance with the present invention.

With reference to FIG. 1, a point stick module in accordance with the present invention comprises a point stick device 100 and a signal processing device 400, wherein the point stick device 100 comprises a sensing device 10, a rank unit 20 and a transmission device 30. The sensing device 10 generates multiple sensing signals in response to operations of a user. The rank unit 20 provides a rank signal corresponding to a rank of the sensing device 10. The rank signal is determined based on intensities of the sensing signals output from the sensing device 10 under an operating condition. The transmission device 30 transmits the sensing signals and the rank signal to the signal processing device 400. The signal processing device 400 determines a parameter applied to a processing procedure according to the rank signal. The parameter may be, for example, a gain for analog to digital conversion, or a compensation value. The signal processing device 400 processes the sensing signals by the processing procedure to generate multiple output values.

Figure 2:
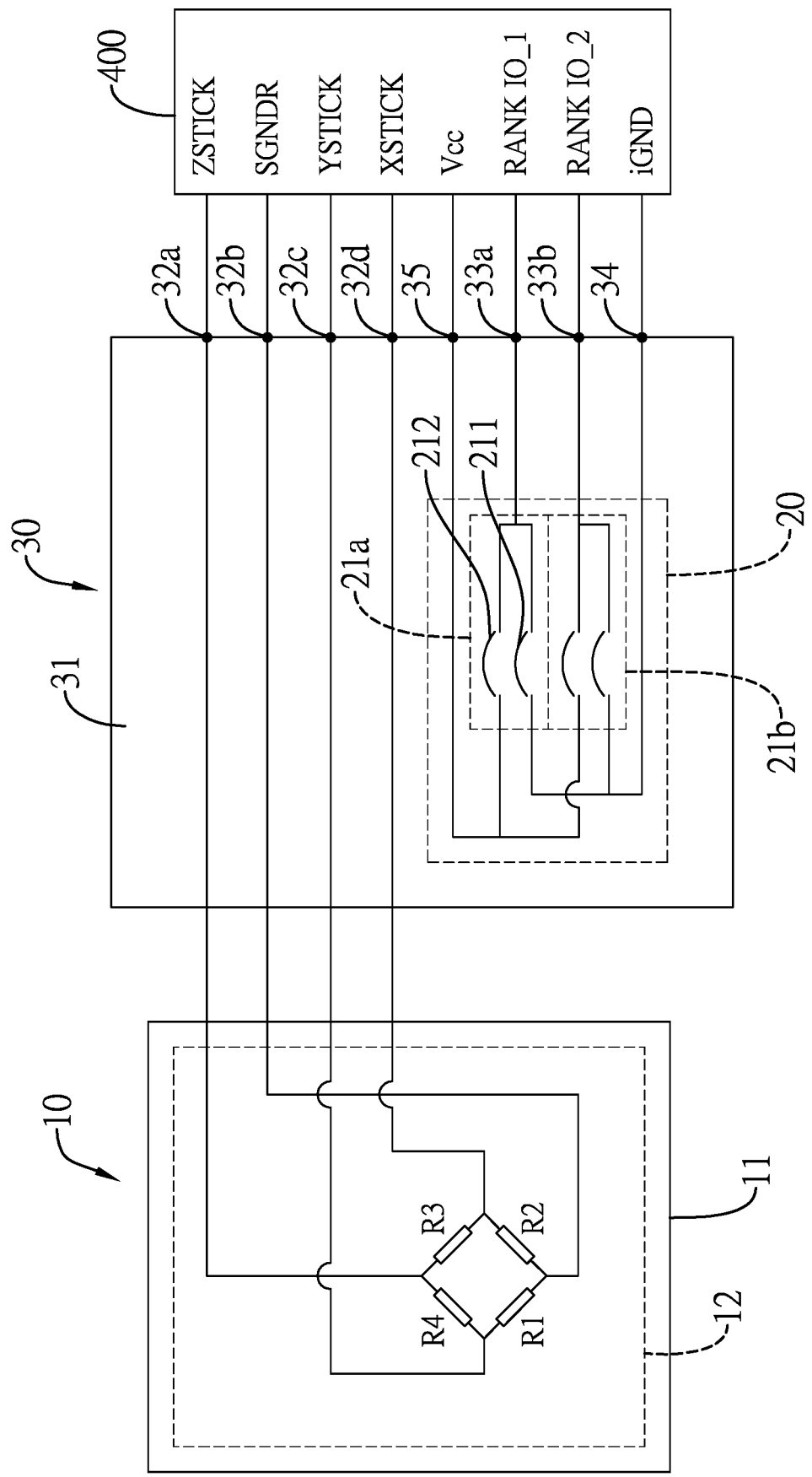
FIG. 2 shows a first embodiment of the point stick module of the present invention.

The point stick module will be described in detail with reference to the accompanying drawings. With reference to FIG. 2, in a first embodiment of the point stick module, the sensing device 10 comprises a first circuit board 11, a sensor 12 and a stick (not shown). The sensor 12 is provided on the first circuit board 11 and generates the sensing signals in response to a force exerted on the stick by a user. The sensor 12 comprises a first resistor R1, a second resistor R2, a third resistor R3 and a fourth resistor R4. The resistors R1 to R4 are sequentially connected, and the fourth resistor R4 is further connected to the first resistor R1. Each of the sensing signals is outputted from two adjacent resistors. The four resistors R1 to R4 may be variable resistors connected to form a Wheatstone bridge. According to the intensities of the sensing signals, the sensing device 10 can be classified as one of M different ranks, wherein M is an integer greater than or equal to two. In this embodiment, there are three ranks A, B and C for classifying the sensing device 10. According to the intensities of the sensing signals generated by the sensing device 10, the sensing device 10 is classified as one of the ranks A, B and C.

In one embodiment, the rank of the sensing device 10 is determined by the sensing signals output from the sensing device 10. For example, there are three ranks A, B and C for classifying the sensing device 10, wherein rank A corresponds to a range from 3.653 to 4.316 mV, rank B corresponds to a range from 4.316 to 4.661 mV, and rank C corresponds to a range from 4.661 to 5.034 mV. During a testing process, a preset force is exerted on the stick of the sensing device 10 for generating a sensing signal, and a reference value may be subtracted from the sensing signal to obtain a variation such as 3.8 mV. Since the variation, i.e. 3.8 mV, is within the range corresponding to rank A, the sensing device 10 is accordingly classified as rank A. Other different methods for classifying the sensing device 10 are practicable and not limited to the foregoing example.

In this embodiment, the transmission device 30 comprises a second circuit board 31. There is no limitation to the form of the second circuit board 31. For example, the second circuit board 31 may be a flexible circuit board (FPC), a printed circuit board or other medium capable of transmitting signals. The second circuit board 31 is provided with multiple signal terminals 32a-32d, N identification terminals 33a, 33b, a first voltage terminal 34 and a second voltage terminal 35. The signal terminals 32a-32d are coupled to the sensing device 10 for transmitting the sensing signals to the signal processing device 400. The N identification terminals 33a, 33b are coupled to the rank unit 20 and the rank signal is transmitted to the signal processing device 400 through the identification terminals 33a, 33b. The N identification terminals 33a, 33b may define $2^N$ ranks. In this embodiment, two identification terminals 33a, 33b may define 4 ranks. The more the ranks are classified, the more the identification terminals are required. A first voltage, for example a low voltage, supplied by the signal processing device 400 is received through the first voltage terminal 34. A second voltage, for example a high voltage, supplied by the signal processing device 400 is received through the second voltage terminal 35. The first voltage and the second voltage have different voltage levels.

In this embodiment, the rank unit 20 is provided on the second circuit board 31 of the transmission device 30 and comprises N setting units 21a, 21b. The number of the setting units 21a to 21b is the same as the number of the identification terminals 33a, 33b. The N setting units 21a, 21b are respectively coupled to the N identification terminals 33a, 33b. Each of the setting units 21a, 21b is used to couple a respective identification terminal 33a, 33b to the first voltage terminal 34 or the second voltage terminal 35 so that each of the identification terminals 33a, 33b outputs the first voltage or the second voltage. In the embodiment of FIG. 2, each of the setting units 21a, 21b comprises a first wire 211 and a second wire 212. Taking the setting unit 21a coupled to the identification terminal 33a as an example, each of the first wire 211 and the second wire 212 has one end coupled to the respective identification terminal 33a, the other end of the first wire 211 is coupled to the first voltage terminal 34 to receive the first voltage, and the other end of the second wire 212 is coupled to the second voltage terminal 35 to receive the second voltage. By cutting off one of the first wire 211 and the second wire 212, a voltage level of the respective identification terminal 33a is determined. When the first wire 211 is cut off, the respective identification terminal 33a is coupled to the second voltage terminal 35 through the second wire 212 so that the voltage level of the identification terminal 33a is the second voltage. When the second wire 212 is cut off, the respective identification terminal 33a is coupled to the first voltage terminal 34 through the first wire 211 so that the voltage level of the identification terminal 33a is the first voltage. In one embodiment, conductive wires such as copper wires on the second circuit board 31 are used as the first wire 211 and the second wire 212.

Since each of the identification terminals 33a, 33b may be set to output the first voltage or the second voltage, $2^N$ voltage combinations can be obtained based on the N identification terminals to provide $2^N$ rank signals for representing $2^N$ ranks. In the embodiment of FIG. 2, the voltage levels of the N identification terminals 33a, 33b are used as the rank signal to represent the rank of the sensing device 10. With reference to the following table,

| Rank of the sensing device 10 | First identification terminal 33a | Second identification terminal 33b |
| --- | --- | --- |
| A | First voltage (low voltage) | First voltage (low voltage) |
| B | First voltage (low voltage) | Second voltage (high voltage) |
| C | Second voltage (high voltage) | First voltage (low voltage) | if the sensing device 10 is classified as rank A, the second wire 212 in each of the setting units 21a, 21b is cut off, and both the first identification terminal 33a and the second identification terminal 33b receive the first voltage. By cutting off the first wire 211 or the second wire 212 of each of the setting units 21a, 21b, the voltage levels of the first identification terminal 33a and the second identification terminal 33b can be set to provide other rank signals.

The signal processing device 400 receives the sensing signals and the rank signal through the transmission device 30. The signal processing device 400 comprises multiple first terminals ZSTICK, SGNDR, YSTICK and XSTICK respectively coupled to the signal terminals 32a to 32d, N rank terminals RANK IO_1, RANK IO_2 respectively coupled to the identification terminals 33a, 33b, a first power terminal iGND coupled to the first voltage terminal 34, and a second power terminal Vcc coupled to the second voltage terminal 35. In this embodiment, N is equal to 2. The signal processing device 400 selects a parameter for applying to a processing procedure according to the rank signal received from the N rank terminals RANK IO_1 and RANK IO_2. The signal processing device 400 processes the sensing signals by the processing procedure that utilizes the selected parameter, thus obtaining multiple output values. Taking the embodiment of FIG. 2 as an example, an output value in the X direction can be obtained after the processing procedure processes the sensing signal received from the terminal XSTICK, an output value in the Y direction can be obtained after the processing procedure processes the sensing signal received from the terminal YSTICK, and an output value in the Z direction can be obtained after the processing procedure processes the sensing signal received from the terminal ZSTICK. In one embodiment, the output values are applied to determine a moving direction and a moving distance of a cursor. In one embodiment, the output values are applied to determine a moving direction and a moving distance of a cursor. In the embodiment of FIG. 2, the multiple sensing signals are analog signals. The processing procedure comprises converting the sensing signals to digital signals by an analog to digital converter, and subsequent processing to the digital signals. In one embodiment, the parameter is a gain of the analog to digital converter, which causes a change in the values of the digital signals output by the digital to analog converter. The greater the gain is, the grater the digital signals are output by the analog to digital converter. In another embodiment, the parameter is a compensation value. For example, the processing procedure comprises processing the sensing signal to obtain an initial value, and computing (e.g., multiplying or adding) the initial value with the compensation value to obtain the output value. The greater the compensation value is, the grater the output value is obtained. With reference to the following table, when the sensing device 10 is identified as rank A according to the rank signal, the signal processing device 400 selects the parameter G1. If the sensing device 10 is identified as rank B or rank C, another parameter G2 or G3 will be selected.

| Rank of the sensing device 10 | Parameter |
| --- | --- |
| A | G1 |
| B | G2 |
| C | G3 |

The values of the parameters G1 to G3 may be determined experimentally in such a way that when the sensing devices 10 of different ranks are operated under the same force, the output values generated by the signal processing device 400 are substantially the same. For example, the parameters G1, G2 and G3 are gains for the analog to digital converter, wherein G1>G2>G3. For a sensing device 10 having low signal output capability, for example rank A, the signal processing device 400 selects a greater gain for analog to digital conversion so as to produce a greater output value. In another embodiment, the parameters G1, G2 and G3 are the compensation values mentioned above, wherein G1>G2>G3. For a sensing device 10 having low signal output capability, for example rank A, the signal processing device 400 selects a greater compensation value to produce a greater output value. As a result, different point stick modules may have substantially same performance.

Figure 3:
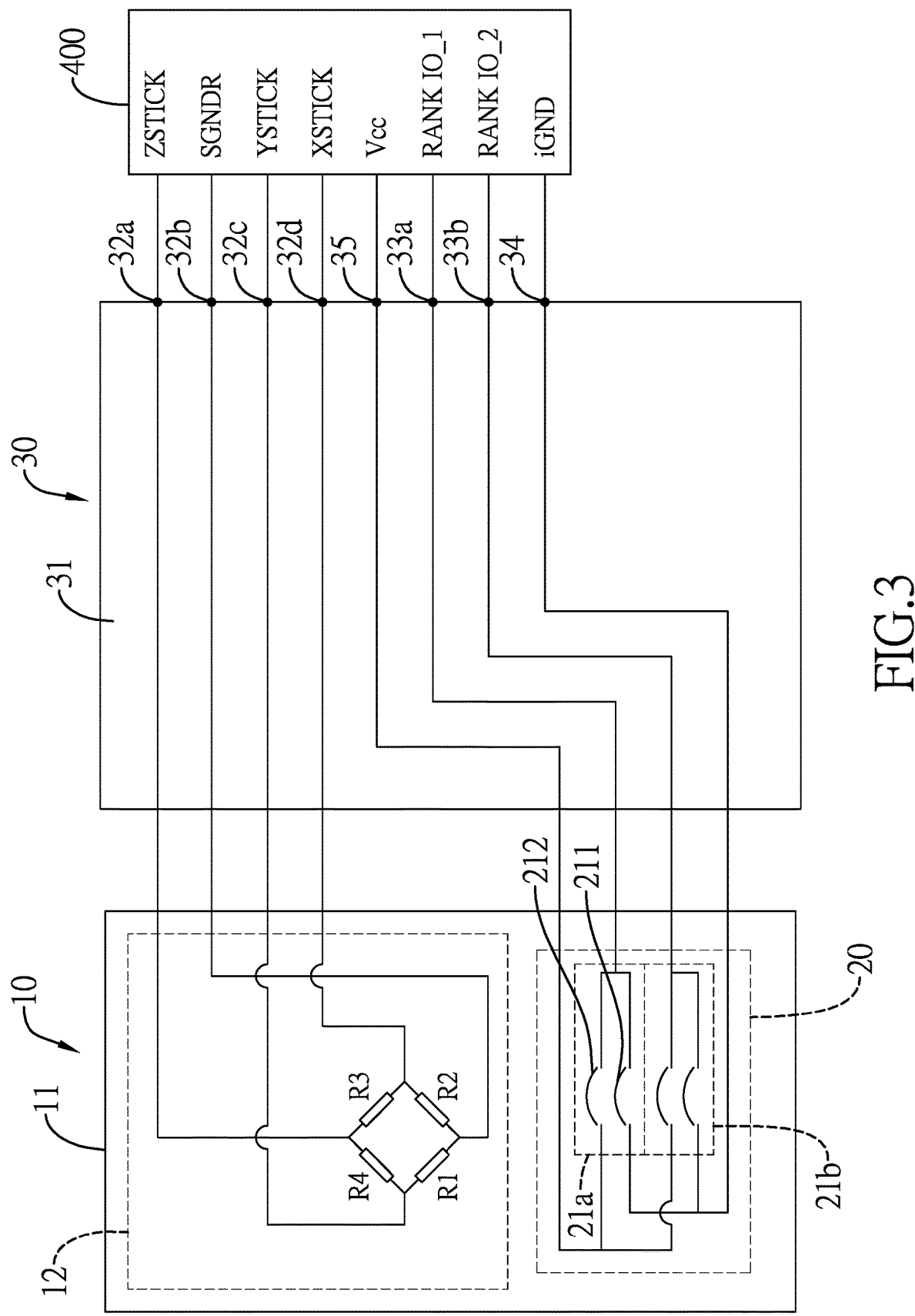
FIG. 3 shows a second embodiment of the point stick module of the present invention.

With reference to the second embodiment of FIG. 3, the rank unit 20 is provided on the first circuit board 11 of the sensing device 10 rather than on the transmission device 30. The rank signal is transmitted to the signal processing device 400 through the transmission device 30.

Figure 4:
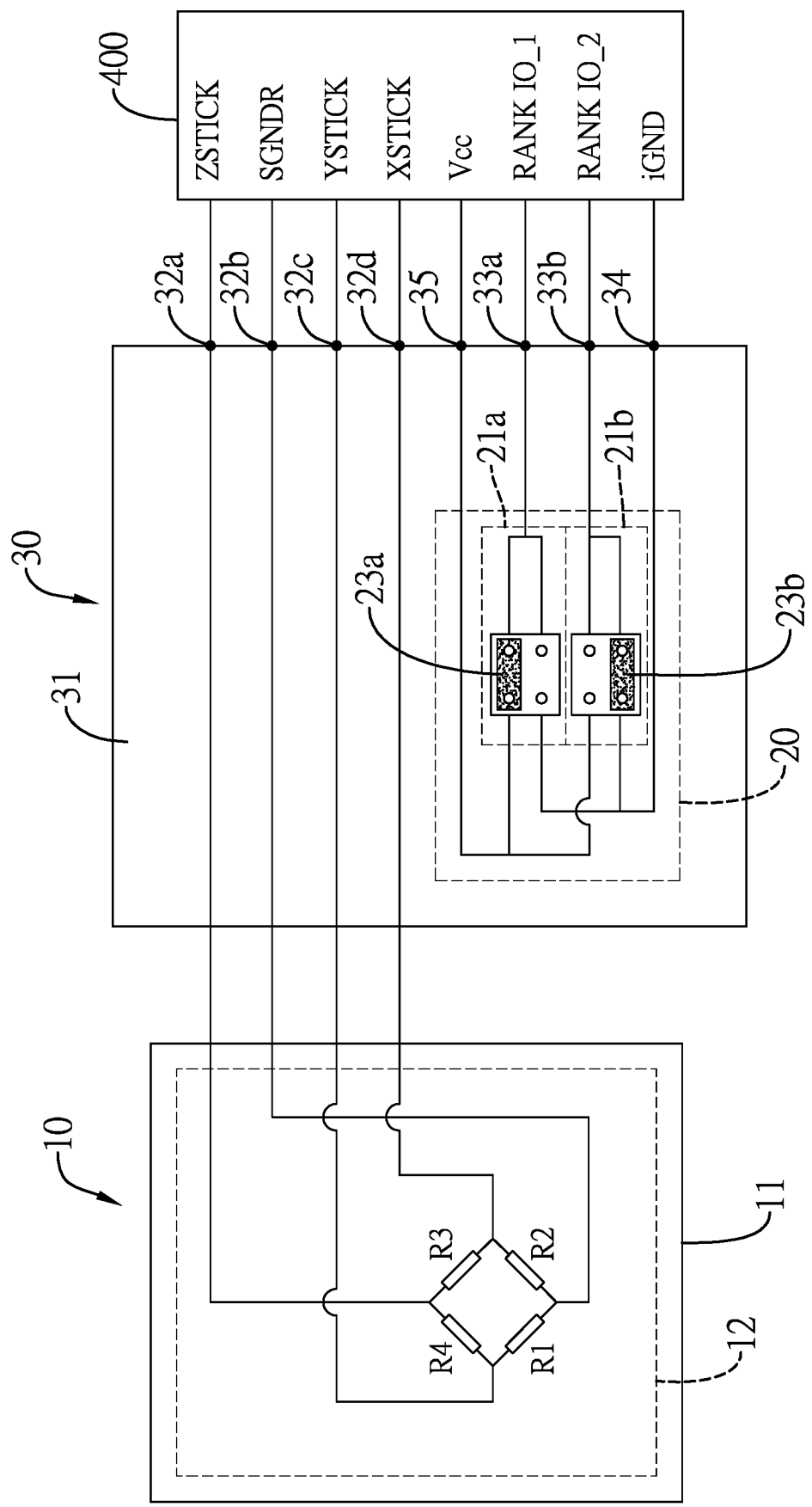
FIG. 4 shows a third embodiment of the point stick module of the present invention.

The third embodiment shown in FIG. 4 differs from the first embodiment of FIG. 1 in that each of the setting units 21a, 21b of the rank unit 20 comprises a jumper 23a, 23b to couple the respective identification terminal 33a, 33b to the first voltage terminal 34 or the second voltage terminal 35. Taking the embodiment of FIG. 4 as an example, in the setting unit 21a corresponding to the first identification terminal 33a, the jumper 23a has two ends, one end of the jumper 23a is coupled to the first identification terminal 33a, and the other end of the jumper 23a is coupled to the second voltage terminal 35 so that the first identification terminal 33a is set to the second voltage. In the setting unit 21b corresponding to the second identification terminal 33b, one end of the jumper 23b is coupled to the second identification terminal 33b, and the other end of the jumper 23b is coupled to the first voltage terminal 34 so that the second identification terminal 33b is set to the first voltage. There is no limitation to the form of the jumper. For example, in one embodiment, a circuit board provided with the setting units 21a, 21b has multiple pins respectively coupled to the identification terminals 33a, 33b, the first voltage terminal 34 and the second voltage terminal 35. Each jumper is a connector having two ends, wherein one end of the connector is coupled to the pin connected to a respective identification terminal 33a, 33b, and the other end of the connector is coupled to the pin connected to the first voltage terminal 34 or the pin connected to the second voltage terminal 35 such that the identification terminal 33a, 33b is coupled to the first voltage or the second voltage.

Figure 5:
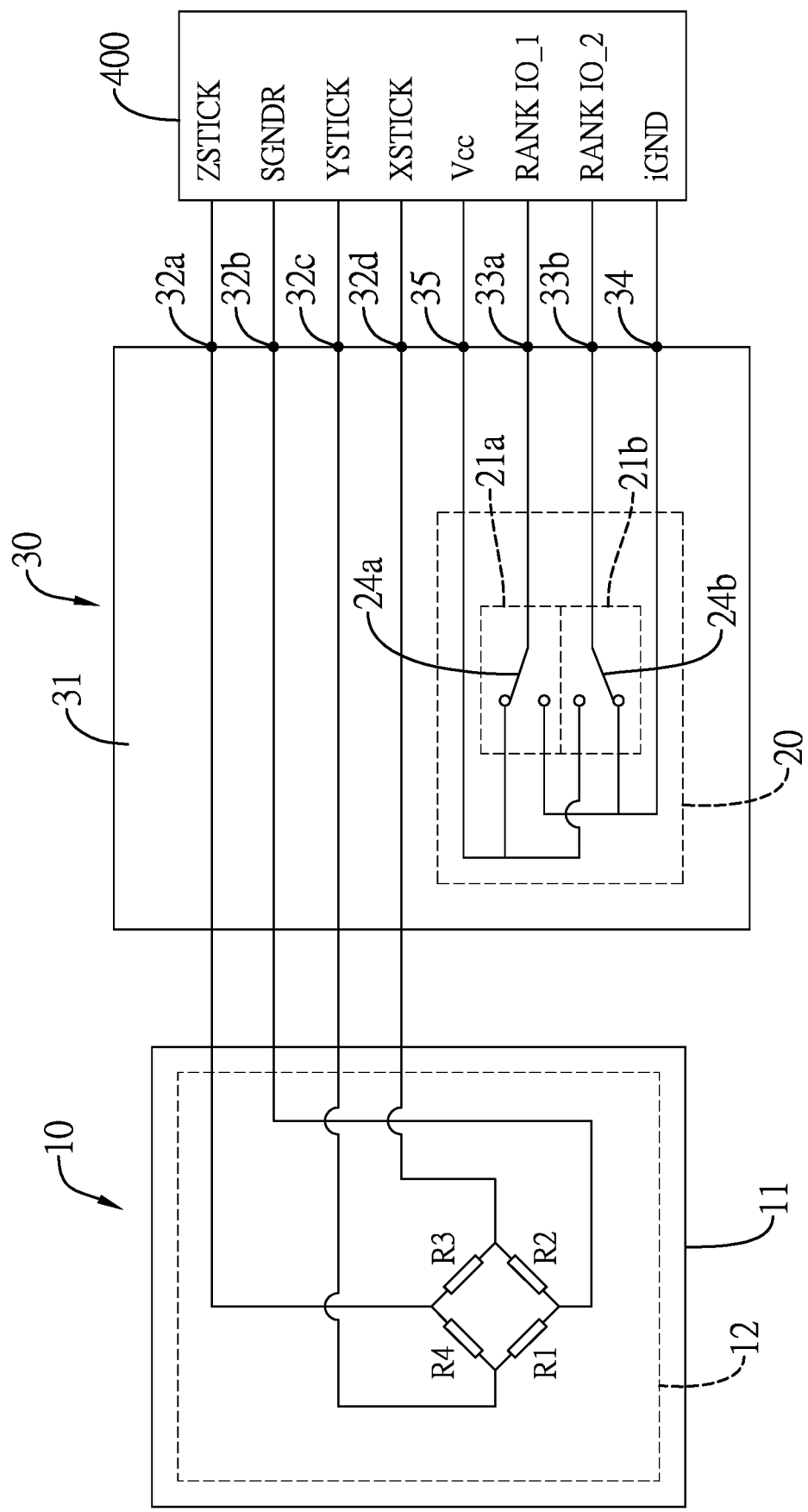
FIG. 5 shows a fourth embodiment of the point stick module of the present invention.

The fourth embodiment shown in FIG. 5 differs from the first embodiment of FIG. 1 in that each of the setting units 21a, 21b of the rank unit 20 comprises a switch 24a, 24b for coupling the respective identification terminal 33a, 33b to the first voltage terminal 34 or the second voltage terminal 35. Taking the embodiment of FIG. 5 as an example, in the setting unit 21a corresponding to the first identification terminal 33a, one end of the switch 24a is coupled to the first identification terminal 33a, and the other end of the switch 24a is coupled to the second voltage terminal 35 so that the first identification terminal 33a is set to the second voltage. In the setting unit 21b corresponding to the second identification terminal 33b, one end of the switch 24b is coupled to the second identification terminal 33b, and the other end of the switch 24b is coupled to the first voltage terminal 34 so that the second identification terminal 33b is set to the first voltage.

Figure 6:
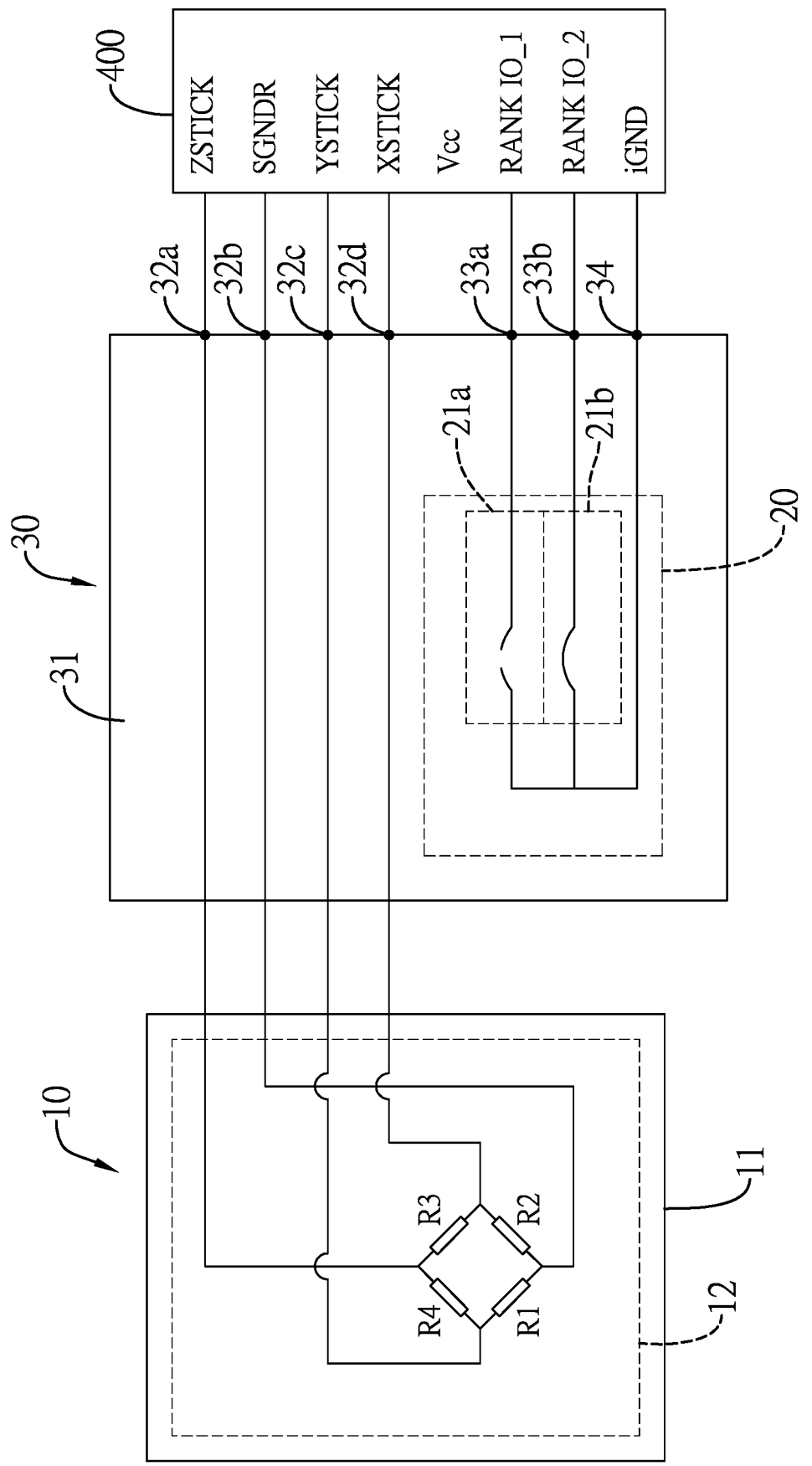
FIG. 6 shows a fifth embodiment of the point stick module of the present invention.

The fifth embodiment shown in FIG. 6 differs from the first embodiment of FIG. 1 in that each of the rank terminals RANK IO_1 and RANK IO_2 is preset to a first state, for example, preset to the second voltage (initial high) or the first voltage (i.e. initial low). Each of the setting units 21a, 21b of the rank unit 20 is used to couple a respective identification terminal 33a, 33b to the first voltage terminal 34, or set the respective identification terminal 33a, 33b to a floating state. For example, as shown in FIG. 6, because the setting unit 21a is open, the first identification terminal 33a is not coupled to the first voltage terminal 34 and keeps in the floating state, such that the rank terminal RANK IO_1 corresponding to the first identification terminal 33a remains at the preset second voltage (high voltage level). The second identification terminal 33b is coupled to the first voltage terminal 34 through the setting unit 21b and has the first voltage (low voltage level), such that the rank terminal RANK IO_2 corresponding to the second identification terminal 33b turns to be at the first voltage (low voltage level).

The invention provides a rank signal by the rank unit 20 to represent the rank of the sensing device 10, such that the signal processing device 400 selects a parameter corresponding to the rank of the sensing device 10 according to the rank signal. Therefore, different point stick modules may have similar performance. There is no need to prepare different signal processing modules to operate in conjunction with the sensing devices of different ranks. The invention reduces the complexity of production management or assembly management of the point stick modules.

Figure 7:
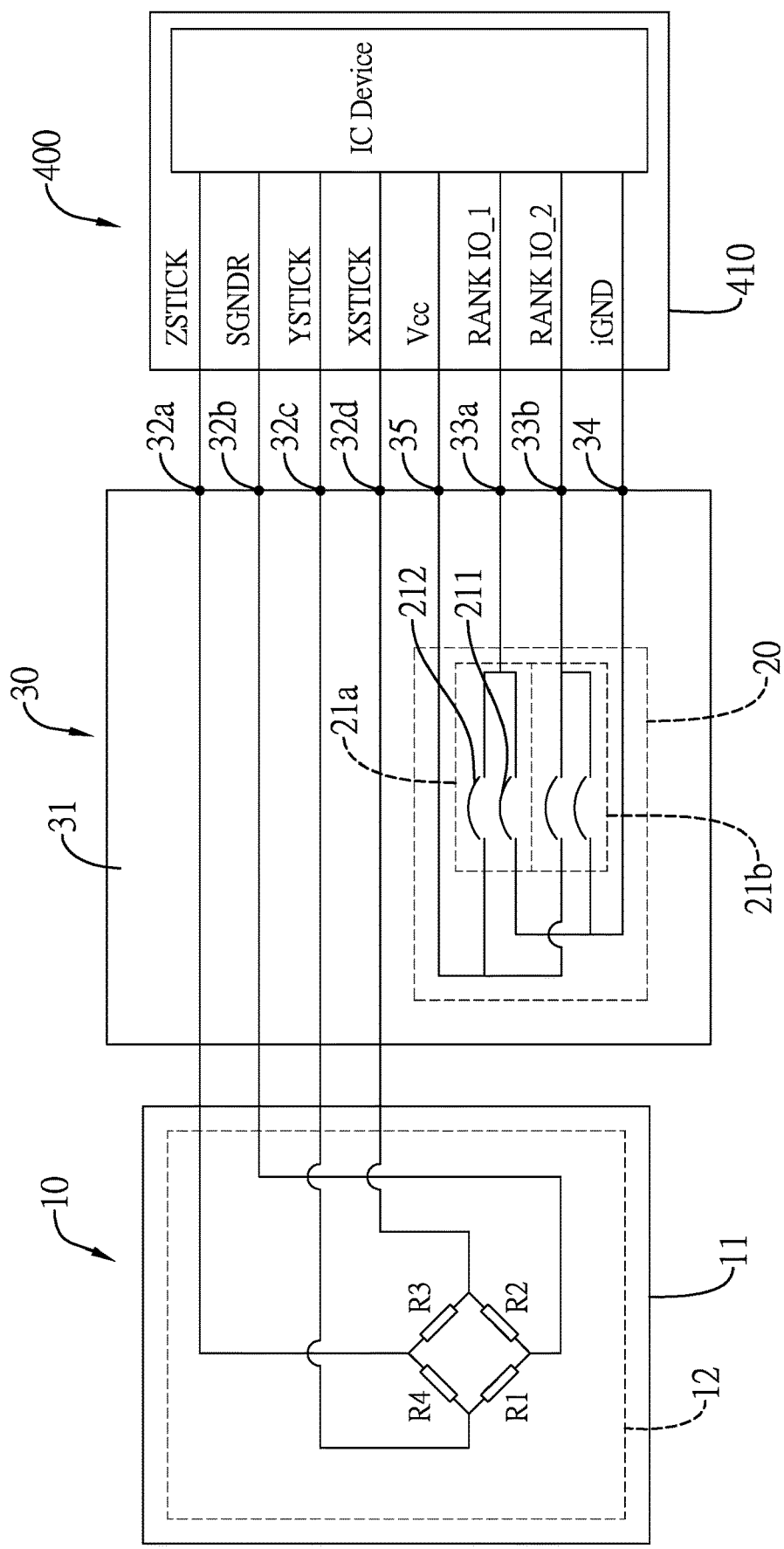
FIG. 7 shows a sixth embodiment of the point stick module of the present invention.
Figure 8:
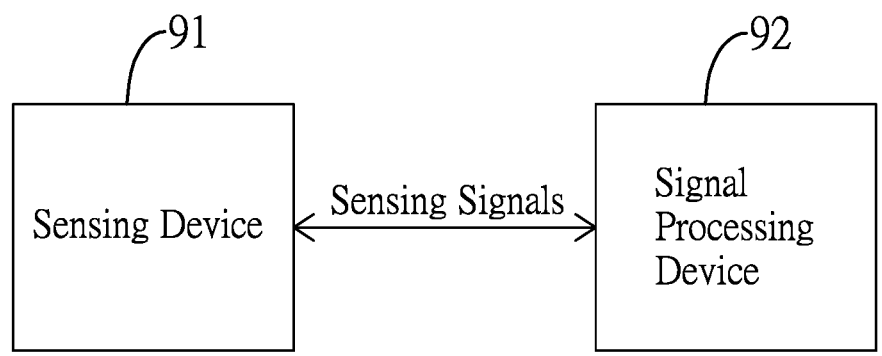
FIG. 8 is a block diagram of a conventional point stick module.

In one embodiment, the signal processing device 400 is an integrated circuit device coupled to the transmission device 30 and having a part or all of the terminals described above. In another embodiment, as shown in FIG. 7, the signal processing device 400 comprises a circuit board 410 and an integrated circuit device provided on the circuit board 410. The circuit board 410 has the terminals described above for coupling to the transmission device 30. Thus the integrated circuit device is coupled to the terminals through circuit layouts on the circuit board 410 to receive the multiple sensing signals and the rank signal. The integrated circuit device may be understood as a controller for the point stick device 100, which comprises a processing unit coupled to a processing circuit. The processing circuit, comprising the analog to digital converter, is coupled to the multiple first terminals ZSTICK, SGNDR, YSTICK and XSTICK to process the sensing signals received from the first terminals. In one embodiment, the processing unit is coupled to the rank terminals RANK IO_1 and RANK IO_2 and selects a parameter applied to a processing procedure according to signals received from the rank terminals RANK IO_1 and RANK IO_2. The integrated circuit device processes the sensing signals by the processing procedure that adopts the selected parameter, wherein the processing procedure may be implemented by the processing unit and the processing circuit. In comparison to a controller or a control module of a conventional point stick module, at least one rank terminal is provided in the integrated circuit device or the signal processing device 400 in accordance with the present invention. The integrated circuit device or the signal processing device 400 in accordance with the present invention is capable of identifying the rank of the sensing device 10 and accordingly selecting an appropriate parameter. The processing of the sensing signals is well known for people familiar with the point stick module, and is not redundantly described herein. In one embodiment, the signal processing device 400 comprises a resistor coupled between a voltage source and the terminal ZSTICK. The signal processing device 400 provides a sensing voltage by the terminal ZSTICK and a ground voltage by the terminal SGNDR to the sensor 12, i.e. the Wheatstone bridge, of the sensing device. 10, and determines an output in the Z-axis direction of the sensor 10 according to the signal of the terminal ZSTICK. The operating and sensing of the sensor 12 are well known for people familiar with the point stick module, and is not discussed herein.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A point stick device comprising:
a sensing device comprising multiple variable resistors for generating multiple sensing signals;
a rank unit for providing a rank signal, wherein the rank signal corresponds to a rank of the sensing device; and
a transmission device coupled to the sensing device and the rank unit for transmitting the multiple sensing signals and the rank signal.

2. The point stick device as claimed in claim 1, wherein the sensing device comprises a first circuit board, and the multiple variable resistors and the rank unit are provided on the first circuit board.

3. The point stick device as claimed in claim 1, wherein the transmission device comprises a second circuit board, and the rank unit is provided on the second circuit board.

4. The point stick device as claimed in claim 1, wherein the transmission device comprises:
multiple signal terminals for transmitting the multiple sensing signals;
N identification terminals through which the rank signal is transmitted;
a first voltage terminal through which a first voltage is received; and
a second voltage terminal through which a second voltage is received; and
the rank unit comprises:
N setting units respectively coupled to the N identification terminals, wherein each of the setting units is used to couple a respective one of the identification terminals to the first voltage terminal or the second voltage terminal, and the N is a positive integer.

5. The point stick device as claimed in claim 4, wherein each of the setting units is a jumper or a switch.

6. The point stick device as claimed in claim 4, wherein each of the setting units comprises a first wire and a second wire, one of the first wire and the second wire is used to couple the respective one of the identification terminals to the first voltage terminal or the second voltage terminal, while the other one of the first wire and the second wire is cut off.

7. The point stick device as claimed in claim 4, wherein the multiple variable resistors comprises a first resistor, a second resistor, a third resistor and a fourth resistor sequentially connected, and the first resistor is further connected to the fourth resistor.

8. The point stick device as claimed in claim 1, wherein the transmission device comprises:
multiple signal terminals for transmitting the multiple sensing signals;
N identification terminals through which the rank signal is transmitted; and
a first voltage terminal through which a first voltage is received; and
the rank unit comprises:
N setting units respectively coupled to the N identification terminals, wherein each of the setting units is used to couple a respective one of the identification terminals to the first voltage terminal, or set the respective one of the identification terminals to a floating state, and the N is a positive integer.

9. The point stick device as claimed in claim 8, wherein each of the setting units is a jumper or a switch.

10. The point stick device as claimed in claim 8, wherein each of the setting units comprises a first wire and a second wire, one of the first wire and the second wire is used to couple the respective one of the identification terminals to the first voltage terminal or the second voltage terminal, while the other one of the first wire and the second wire is cut off.

11. The point stick device as claimed in claim 8, wherein the multiple variable resistors comprises a first resistor, a second resistor, a third resistor and a fourth resistor sequentially connected, and the first resistor is further connected to the fourth resistor.

12. The point stick device as claimed in claim 1, wherein the multiple variable resistors are connected to form a Wheatstone bridge.

13. A point stick module comprising:
a sensing device comprising multiple variable resistors for generating multiple sensing signals;
a rank unit for providing a rank signal, wherein the rank signal corresponds to a rank of the sensing device;

a transmission device coupled to the sensing device and the rank unit for transmitting the multiple sensing signals and the rank signal; and a signal processing device coupled to the transmission device for receiving the multiple sensing signals and the rank signal, wherein the signal processing device selects a parameter applied to a processing procedure according to the rank signal, and the signal processing device processes the multiple sensing signals to obtain multiple output values by the processing procedure.

14. The point stick module as claimed in claim 13, wherein the signal processing device comprises:

multiple first terminals for receiving the multiple sensing signals; and

N rank terminals for receiving the rank signal.

15. The point stick module as claimed in claim 13, wherein the sensing device comprises a first circuit board, and the multiple variable resistors and the rank unit are provided on the first circuit board.

16. The point stick module as claimed in claim 13, wherein the transmission device comprises a second circuit board, and the rank unit is provided on the second circuit board.

17. The point stick module as claimed in claim 13, wherein the transmission device comprises:

multiple signal terminals coupled to the signal processing device for transmitting the multiple sensing signals to the signal processing device;

N identification terminals coupled to the signal processing device, wherein the rank signal is transmitted to the signal processing device through the identification terminals;

a first voltage terminal through which a first voltage is received; and a second voltage terminal through which a second voltage is received; and the rank unit comprises:

N setting units respectively coupled to the N identification terminals, wherein each of the setting units is used to couple the respective one of the identification terminals to the first voltage terminal or the second voltage terminal, and the N is a positive integer.

18. The point stick module as claimed in claim 17, wherein each of the setting units comprises a jumper or a switch.

19. The point stick module as claimed in claim 17, wherein each of the setting units comprises a first wire and a second wire; one of the first wire and the second wire is used to couple the respective one of the identification terminals to the first voltage terminal or the second voltage terminal, while the other one of the first wire and the second wire is cut off.

20. The point stick module as claimed in claim 13, wherein the transmission device comprises:

multiple signal terminals coupled to the signal processing device for transmitting the multiple sensing signals to the signal processing device;

N identification terminals coupled to the signal processing device, wherein the rank signal is transmitted to the signal processing device through the identification terminals; and a first voltage terminal through which a first voltage is received; and the rank unit comprises:

N setting units respectively coupled to the N identification terminals, wherein each of the setting units is used to couple the respective one of the identification terminals to the first voltage terminal, or set the respective one of the identification terminals to a floating state, and the N is a positive integer.

21. The point stick module as claimed in claim 20, wherein each of the setting units comprises a jumper or a switch.

22. The point stick module as claimed in claim 20, wherein each of the setting units comprises a first wire and a second wire; one of the first wire and the second wire is used to couple the respective one of the identification terminals to the first voltage terminal or the second voltage terminal, while the other one of the first wire and the second wire is cut off.

23. The point stick module as claimed in claim 13, wherein the multiple variable resistors comprises a first resistor, a second resistor, a third resistor and a fourth resistor sequentially connected, and the first resistor is further connected to the fourth resistor.

24. The point stick module as claimed in claim 13, wherein the parameter is a gain or a compensation value.

25. The point stick module as claimed in claim 13, wherein the multiple variable resistors are connected to form a Wheatstone bridge.

* * * * *